(12) United States Patent
Miyazoe et al.

(10) Patent No.: US 10,593,870 B2
(45) Date of Patent: Mar. 17, 2020

(54) SIDEWALL IMAGE TRANSFER ON MAGNETIC TUNNEL JUNCTION STACK FOR MAGNETORESISTIVE RANDOM-ACCESS MEMORY PATTERNING

(71) Applicant: International Business Machines Corporation, Armonk, NY (US)

(72) Inventors: Hiroyuki Miyazoe, White Plains, NY (US); Nathan P. Marchack, New York, NY (US); HsinYu Tsai, San Jose, CA (US); Eugene J. O'Sullivan, Nyack, NY (US); Karthik Yogendra, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/841,872

(22) Filed: Dec. 14, 2017

(65) Prior Publication Data
US 2019/0189914 A1    Jun. 20, 2019

(51) Int. Cl.
*H01L 21/3213* (2006.01)
*H01L 43/12* (2006.01)
*H01L 43/08* (2006.01)
*G11C 11/16* (2006.01)
*H01L 43/02* (2006.01)
(Continued)

(52) U.S. Cl.
CPC ............ *H01L 43/12* (2013.01); *G11C 11/161* (2013.01); *H01L 21/28* (2013.01); *H01L 21/3213* (2013.01); *H01L 27/22* (2013.01); *H01L 27/222* (2013.01); *H01L 27/224* (2013.01); *H01L 29/40111* (2019.08); *H01L 43/02* (2013.01);
(Continued)

(58) Field of Classification Search
CPC . H01L 27/11521; H01L 27/22; H01L 27/222; H01L 27/224; H01L 21/28; H01L 21/28291; H01L 21/3213; H01L 21/76811; H01L 21/76829; H01L 21/127; G11C 11/00; G11C 11/02; G11C 11/15; G11C 11/5607; G11C 14/0036; G11C 14/0081
See application file for complete search history.

(56) References Cited

U.S. PATENT DOCUMENTS 7,265,013 B2   9/2007  Furukawa et al.
8,455,364 B2   6/2013  Kanakasabapathy
(Continued)

OTHER PUBLICATIONS

T. Min et al., "Interconnects Scaling Challenge for Sub-20nm Spin Torque Transfer Magnetic Random Access Memory Technology," IEEE International Interconnect Technology Conference/Advanced Metallization Conference (IITC/AMC), May 20-23, 2014, pp. 341-343.

*Primary Examiner* — Eduardo A Rodela
(74) *Attorney, Agent, or Firm* — Vazken Alexanian; Ryan, Mason & Lewis, LLP

(57) ABSTRACT

A method of forming a semiconductor structure includes forming a first spacer material over two or more mandrels disposed over a magnetoresistive random-access memory (MRAM) stack. The method also includes performing a first sidewall image transfer of the two or more mandrels to form a first set of fins of the first spacer material over the MRAM stack, and performing a second sidewall image transfer to form a plurality of pillars of the first spacer material over the MRAM stack. The pillars of the first spacer material form top electrodes for a plurality of MRAM cells patterned from the MRAM stack.

17 Claims, 18 Drawing Sheets

(51) Int. Cl.
  *H01L 43/10* (2006.01)
  *H01L 27/22* (2006.01)
  *H01L 21/28* (2006.01)
  *H01L 21/033* (2006.01)
(52) U.S. Cl.
  CPC .............. *H01L 43/08* (2013.01); *H01L 43/10* (2013.01); *H01L 21/0337* (2013.01)

(56) References Cited

U.S. PATENT DOCUMENTS

| | | |
|---|---|---|
| 8,802,451 B2 | 8/2014 | Malmhall et al. |
| 9,171,796 B1 | 10/2015 | Brink et al. |
| 9,172,033 B2 | 10/2015 | Sung et al. |
| 9,196,485 B2 | 11/2015 | Leobandung |
| 9,240,329 B2 | 1/2016 | DeVilliers |
| 9,257,637 B2 | 2/2016 | Guo |
| 9,437,443 B2 | 9/2016 | Brink et al. |
| 9,536,744 B1 | 1/2017 | Cheng et al. |
| 9,911,914 B1 * | 3/2018 | Annunziata .............. H01L 43/12 |
| 2014/0269035 A1 | 9/2014 | Manipatruni et al. |
| 2017/0018707 A1 | 1/2017 | Katine |

* cited by examiner

300

400

500

600

650

700

750

800

850

900

950

1000

1050

1100

1150

1200

1250

1400

1500

1600

1650

1700

1750

1800

1850

1900

1950

2000

2050

2100

2150

2200

SIDEWALL IMAGE TRANSFER ON MAGNETIC TUNNEL JUNCTION STACK FOR MAGNETORESISTIVE RANDOM-ACCESS MEMORY PATTERNING

BACKGROUND

The present application relates to semiconductors, and more specifically, to techniques for forming semiconductor structures. Memory cells for computer memory may be formed using semiconductor fabrication processes. Dynamic random-access memory (DRAM) cells are fast and expend little power, but have to be refreshed many times each second and require complex structures to incorporate a capacitor in each DRAM cell. Flash type electronically erasable programmable read-only memory (EEPROM) cells are nonvolatile, have low sensing power, and can be constructed as a single device, but take microseconds to write and milliseconds to erase, which may be too slow for some applications. Magnetic memory cells store information as the orientation of magnetization of a ferromagnetic region, and can hold stored information for long periods of time and are thus nonvolatile. Magnetoresistive (MR) memory cells are a type of magnetic memory cell that uses the magnetic state to alter the electrical resistance of materials near the ferromagnetic region. An array of MR memory cells is referred to as magnetic random-access memory (RAM) or magnetoresistive random-access memory (MRAM).

SUMMARY

Embodiments of the invention provide techniques for patterning MRAM cells utilizing sidewall image transfer processes, with the sidewall image transfer spacer material being utilized in a resulting MRAM device comprising the patterned MRAM cells.

In one embodiment, a method of forming a semiconductor structure comprises forming a first spacer material over two or more mandrels disposed over an MRAM stack. The method also comprises performing a first sidewall image transfer of the two or more mandrels to form a first set of fins of the first spacer material over the MRAM stack, and performing a second sidewall image transfer to form a plurality of pillars of the first spacer material over the MRAM stack. The pillars of the first spacer material form top electrodes for a plurality of MRAM cells patterned from the MRAM stack.

In another embodiment, a semiconductor structure comprises a substrate, a plurality of MRAM cells disposed over the substrate, and a plurality of top electrodes disposed over a top surface of each of the MRAM cells. The plurality of MRAM cells are patterned from an MRAM stack using a first sidewall image transfer and a second sidewall image transfer. The top electrodes comprise a spacer material used to pattern the MRAM stack in the first sidewall image transfer.

In another embodiment, an integrated circuit comprises an MRAM device comprising a substrate, a plurality of MRAM cells disposed over the substrate, and a plurality of top electrodes disposed over a top surface of each of the MRAM cells. The plurality of MRAM cells are patterned from an MRAM stack using a first sidewall image transfer and a second sidewall image transfer. The top electrodes comprise a spacer material used to pattern the MRAM stack in the first sidewall image transfer.

DETAILED DESCRIPTION

Illustrative embodiments of the invention may be described herein in the context of illustrative methods for patterning MRAM cells utilizing sidewall image transfer processes, along with illustrative apparatus, systems and devices having MRAM cells formed using such methods. However, it is to be understood that embodiments of the invention are not limited to the illustrative methods, apparatus, systems and devices but instead are more broadly applicable to other suitable methods, apparatus, systems and devices.

Sidewall image transfer (SIT) processes offer ultimate critical dimension uniformity (CDU) control, which is useful for MRAM applications such as magnetic tunnel junction (MTJ) devices below 20 nanometer (nm) critical dimension (CD) that requires less than 10% size variability (e.g., less than 2 nm sigma CD variation). SIT processes decouple pattern CDU from resist performance limitations, which may be 1.5 nm at best, but are typically in the range of 3 nm for 193 nm negative tone development (NTD) resists.

SIT patterning may be used for memory patterning, such as in DRAM or cross-bar type memories. SIT patterning is less explored for MRAM devices. A typical use of SIT processing includes using the SIT pattern as a lithography layer for subsequent etch transfers. In some embodiments, however, the SIT spacer material is used directly as part of a final structure, such as for a top electrode or hard mask for MRAM cells.

In some embodiments, a hard mask, which may be formed of tantalum nitride (TaN) is patterned over an MRAM or MTJ stack using SIT. The hard mask may be formed using atomic layer deposition (ALD). The use of TaN as a hard mask is advantageous, as it is compatible with ruthenium (Ru), which may be used as a top layer in an MTJ or MRAM stack. Direct patterning of the TaN SIT material as sidewall spacers offers improved CDU control and eliminates the need for a hard mask etching step that limits the smallest size and worsens size uniformity for MRAM devices. MRAM cells may be patterned using ion beam etching (IBE). As will be described in further detail below, IBE to pattern MRAM cells from an MRAM stack may include large (e. g., greater than 10 nm) CD trim. A large CD trim will degrade the CDU of any lithography pattern, and is non-ideal. However, if the CD trim is inevitable, a thicker layer of TaN spacer can be used in the SIT process to compensate for CD loss.

Figure 1:
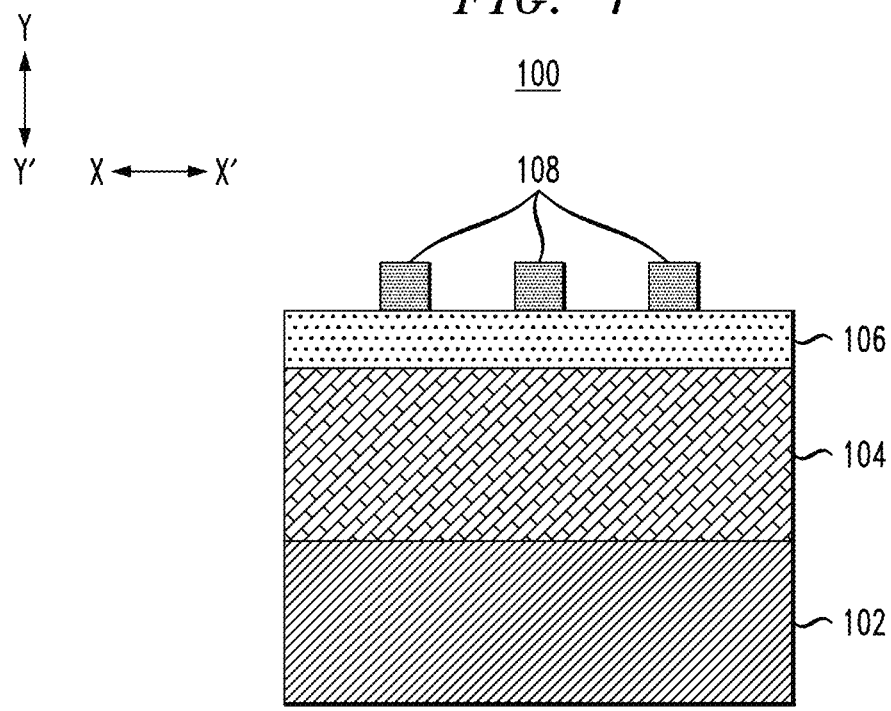
FIG. 1 depicts a side cross-sectional view of resist material patterned over a hard mask and mandrel material disposed on an MRAM stack, according to an embodiment of the invention.

Illustrative processes for forming MRAM devices using SIT patterning processes will now be described with respect to FIGS. 1-22. FIG. 1 shows a side cross-sectional view 100, showing an MRAM stack 102 (also referred to as a MTJ stack). A detailed example of the different layers in MRAM stack 102 will be described in further detail below with respect to FIG. 22. For the purposes of the description below, it is assumed that the MRAM stack 102 represents a top layer of an MRAM or MTJ stack, which may be formed of Ru, although other suitable materials such as iridium (Ir), platinum (Pt), palladium (Pd), gold (Au), tungsten (W), tantalum (Ta), titanium (Ti), tantalum nitride (TaN), etc. may be used.

A mandrel layer 104 is disposed over the MRAM stack 102. The mandrel layer 104 may be formed of spin-on carbon, although other suitable materials such as chemical vapor deposition (CVD) or physical vapor deposition (PVD) carbon (C), amorphous silicon (a-Si), etc. may be used. The mandrel layer 104 may have a vertical thickness or height (in direction Y-Y') ranging from 20 nm to 500 nm.

A hard mask (HM) 106 is formed over the mandrel layer 104. The HM 106 may be formed of silicon nitride (SiN), although other suitable materials such as titanium nitride (TiN), Ti, silicon containing anti-reflection coating (SiARC), silicon oxide (SiO) and silicon (Si). The HM 106 may be formed using PVD, CVD, spin on, etc. The HM 106 may have a vertical thickness or height (in direction Y-Y') ranging from 5 nm to 200 nm.

A photo resist 108 is patterned over the HM 106. The photo resist 108 may be patterned with a pitch of 200 nm, although other pitches may be used, such as pitches in the range of 20 nm to 500 nm.

Figure 2:
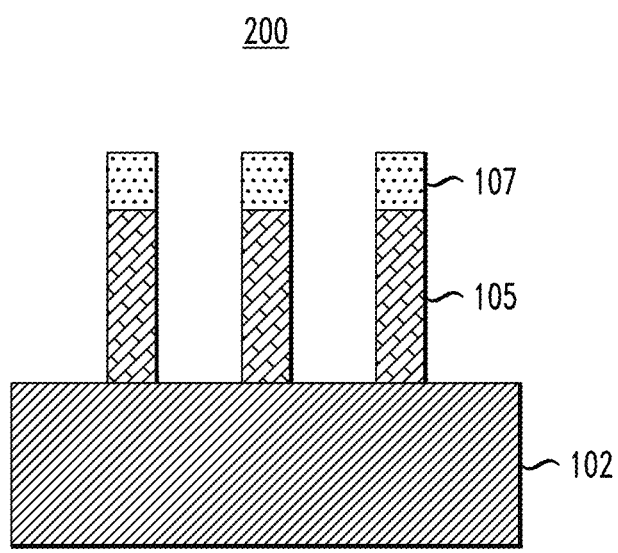
FIG. 2 depicts a side cross-sectional view of the FIG. 1 structure following formation of mandrels and stripping of the resist, according to an embodiment of the invention.

FIG. 2 shows a side cross-sectional view 200 of the FIG. 1 structure following etching of the HM 106 and mandrel material 104 selective to the photo resist 108 to form mandrels 105 each topped by HM 107. Each mandrel 104 may have a horizontal thickness or width (in direction X-X') in the range of 5 nm to 400 nm. The photo resist 108 may be stripped following etching of the mandrel material 104 and HM 106 to form the mandrels 105 topped with HM 107.

Figure 3:
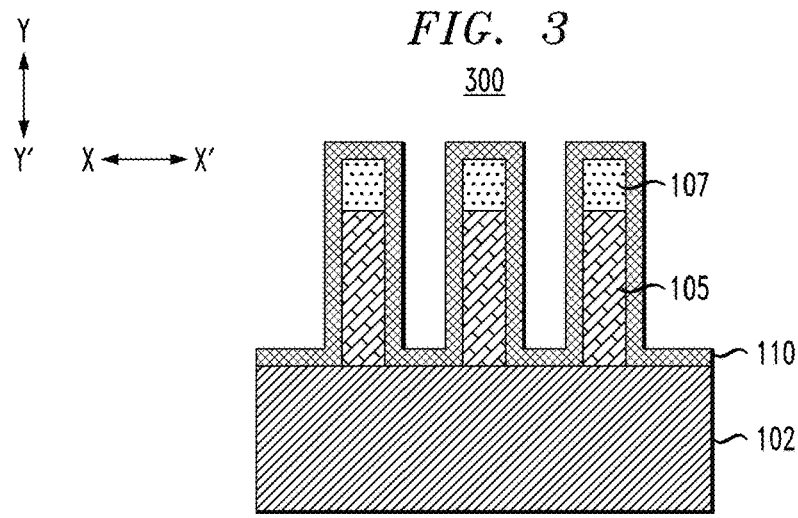
FIG. 3 depicts a side cross-sectional view of the FIG. 2 structure following deposition of a first spacer material over the mandrels and a top surface MRAM stack, according to an embodiment of the invention.

FIG. 3 shows a side cross-sectional view 300 of the FIG. 2 structure following deposition of spacer material 110. The spacer material 110 may be TaN, although other suitable materials such as hafnium oxide (HfO), TiN, zirconium oxide (ZrO), Si, SiO, SiN, etc. may be used. The spacer material 110 may be deposited using atomic layer deposition (ALD), although other suitable process such as PVD and CVD may be used. The spacer material 110 may be deposited with a uniform thickness in the range of 3 nm to 100 nm.

Figure 4:
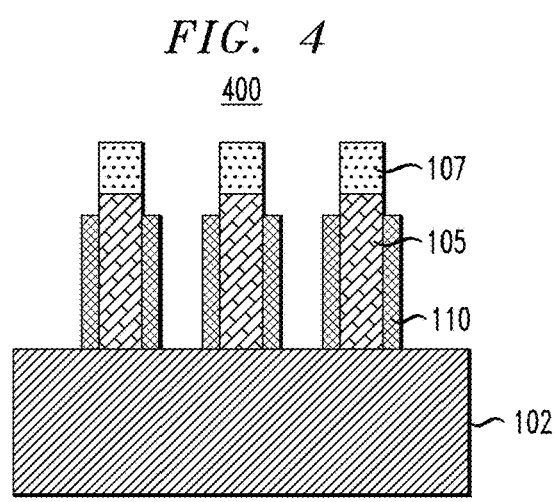
FIG. 4 depicts a side cross-sectional view of the FIG. 3 structure following etching of the first spacer material to expose a portion of the mandrel material and the top surface of the MRAM stack between the mandrels, according to an embodiment of the invention.

FIG. 4 shows a side cross-sectional view 400 of the FIG. 3 structure following etching of the spacer material 110. The spacer material 110 may be etched using an anisotropic or directional etch process such as reactive-ion etching (RIE), plasma etching, etc. to expose a top surface of the MRAM stack 102. The spacer material 110 is also etched to reveal a portion of the mandrels 105 (e.g., the spacer material 110 is etched below the HM 107 to reveal at least a portion of the mandrels 105). A resulting height or vertical thickness (in direction Y-Y') of the spacer material 110 is in the range of 20 nm to 500 nm.

Figure 5:
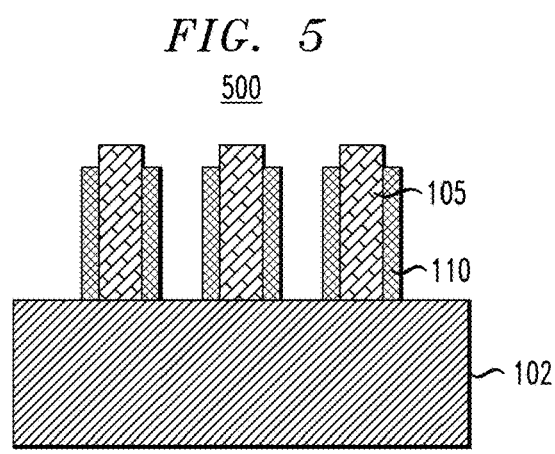
FIG. 5 depicts a side cross-sectional view of the FIG. 4 structure following etching of the hard mask, according to an embodiment of the invention.

FIG. 5 shows a side cross-sectional view 500 of the FIG. 4 structure following etching of the HM 107 formed over each of the mandrels 105. The HM 107 may be etched using wet etch, RIE, etc.

Figure 6A:
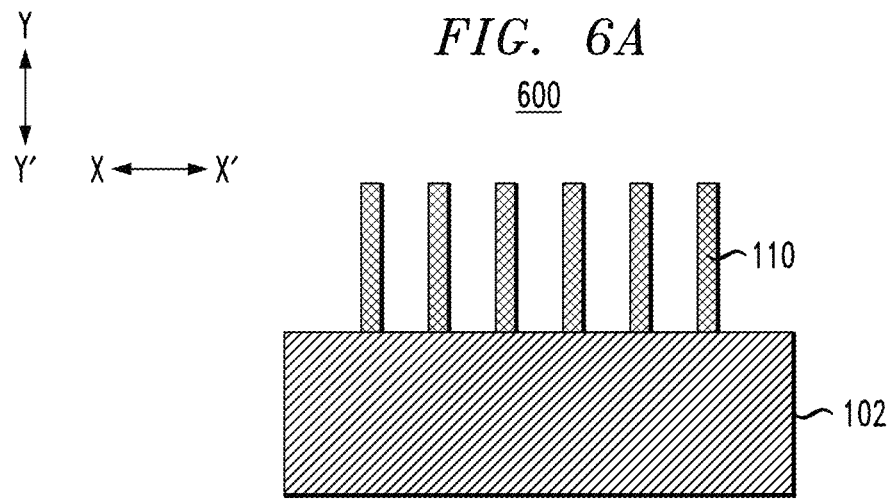
FIG. 6A depicts a side cross-sectional view of the FIG. 5 structure following removal of the two or more mandrels to form a set of fins of the first spacer material, according to an embodiment of the invention.
Figure 6B:
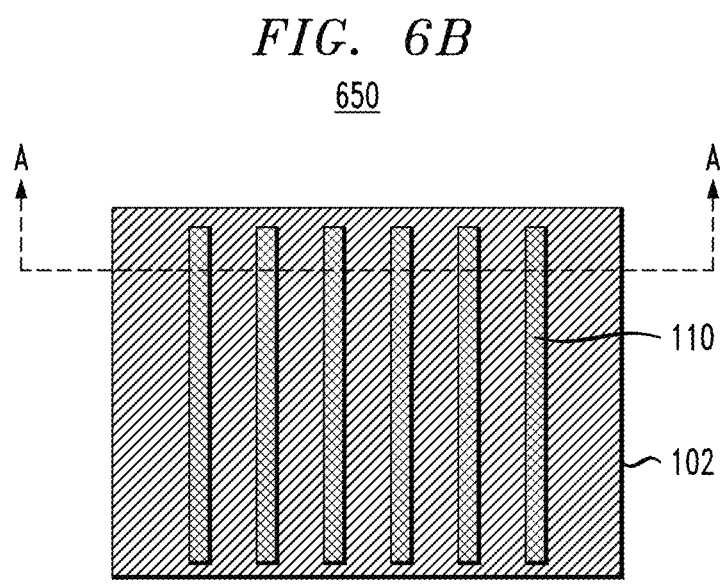
FIG. 6B depicts a top-down view of the FIG. 6A structure, according to an embodiment of the invention.

FIG. 6A shows a side cross-sectional view 600 of the FIG. 5 structure following pulling of the mandrels 105. The side cross-sectional view 600 is taken along the line A-A in the top-down view 650 of FIG. 6B. The mandrels 105 may be pulled using wet etch, RIE, etc. As a result, pillars of the spacer material 110 are formed over the MRAM stack 102. Collectively, the processing in FIGS. 1-6 may be viewed as a first SIT process, where a set of fins of the spacer material 110 are formed over the top surface of the MRAM stack 102. The first SIT process may be viewed as being performed in a "first" direction to form the set of fins of spacer material 110. To form individual pillars of the spacer material 110, a second SIT process in a "second" direction (e.g., one that is substantially perpendicular to the first direction) may be performed.

The second SIT process may proceed with a number of different processing flows. A first flow for the second SIT process will be described with respect to FIGS. 7-10. A second flow for the second SIT process will be described with respect to FIGS. 11-13, and a third flow for the second SIT process will be described with respect to FIGS. 14-21.

Figure 7A:
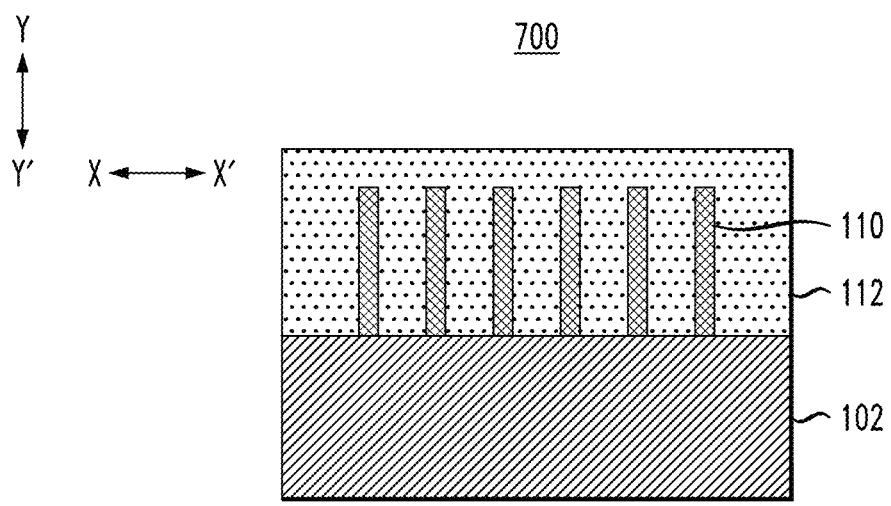
FIG. 7A depicts a side cross-sectional view of the FIG. 6A structure following fill of regions between the set of fins of the first spacer material with a dielectric, according to an embodiment of the invention.
Figure 7B:
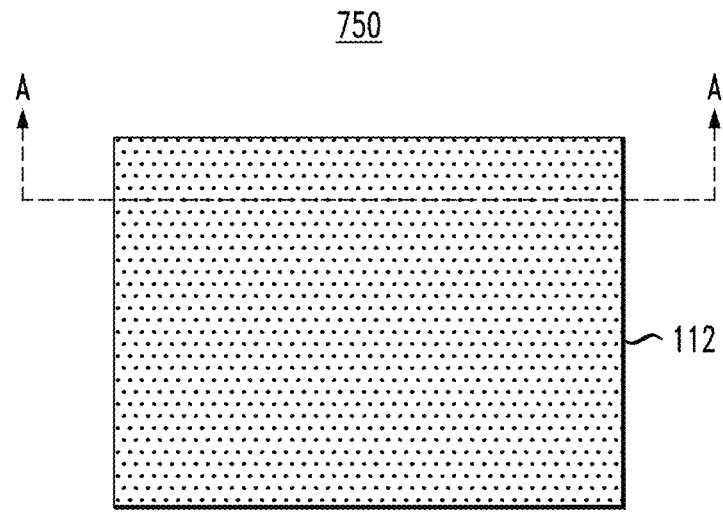
FIG. 7B depicts a top-down view of the FIG. 7A structure, according to an embodiment of the invention.

FIG. 7A depicts a side cross-sectional view 700 of the FIG. 6A structure, following fill of regions between the set of fins of spacer material 110 with a dielectric 112. The side cross-sectional view 700 is taken along the line A-A in the top-down view 750 of FIG. 7B. The dielectric 112 may be planarized after fill of the regions between the spacer material 110. The dielectric 112 may be an oxide, although other suitable materials such as SiN, vapor-deposited carbon, spin on carbon and Si may be used. The dielectric 112 is formed with a vertical thickness or height (in direction Y-Y') from a top surface of the MRAM stack 102 in the range of 21 nm to 1000 nm, so as to completely cover the set of fins spacer material 110. This is illustrated by the top-down view 750 of FIG. 7B.

Figure 8A:
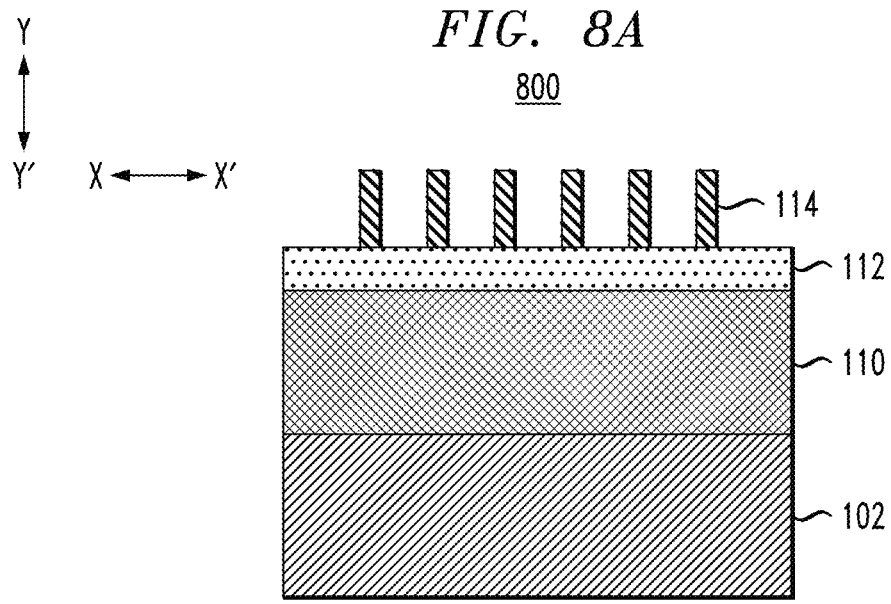
FIG. 8A depicts a side cross-sectional view of the FIG. 7A structure, following patterning of another set of fins of a second spacer material over the dielectric, according to an embodiment of the invention.
Figure 8B:
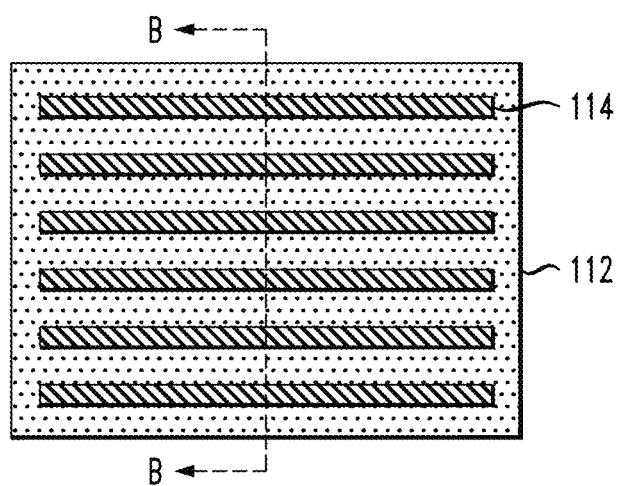
FIG. 8B depicts a top-down view of the FIG. 8A structure, according to an embodiment of the invention.

FIG. 8A depicts a side cross-sectional view 800 of the FIG. 7A structure following patterning of a set of fins of another spacer material 114 over the dielectric 112. The side cross-sectional view 800 is taken along the line B-B in the top-down view 850 of FIG. 8B. As illustrated, the set of fins of spacer material 114 is formed in a direction that is substantially perpendicular to that of the set of fins of spacer material 110. The spacer material 114 may be silicon nitride (SiN), although other suitable materials such as SiO, TaN, HfO, TiN, and Si may be used. The spacer material 114 may be formed and patterned using SIT. The set of fins of spacer material 114 may be formed with a height or vertical thickness (in direction Y-Y') ranging from 10 nm to 1000 nm, and with a width or horizontal thickness (in direction X-X') ranging from 3 nm to 100 nm. The set of fins of spacer material 114 may be formed using a SIT process similar to that described above with respect to formation of the set of fins of spacer material 110. The set of fins of spacer material 114 may have spacing or pitch in the range of 5 nm to 1000 nm.

Figure 9A:
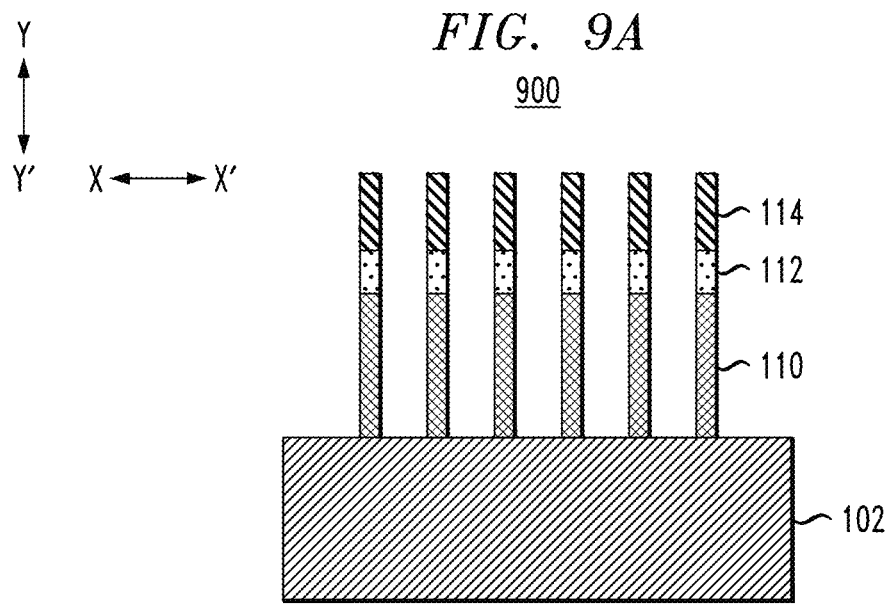
FIG. 9A depicts a side cross-sectional view of the FIG. 8A structure following etching of the dielectric and the first spacer material between the set of fins of the second spacer material to expose a top surface of the MRAM stack, according to an embodiment of the invention.
Figure 9B:
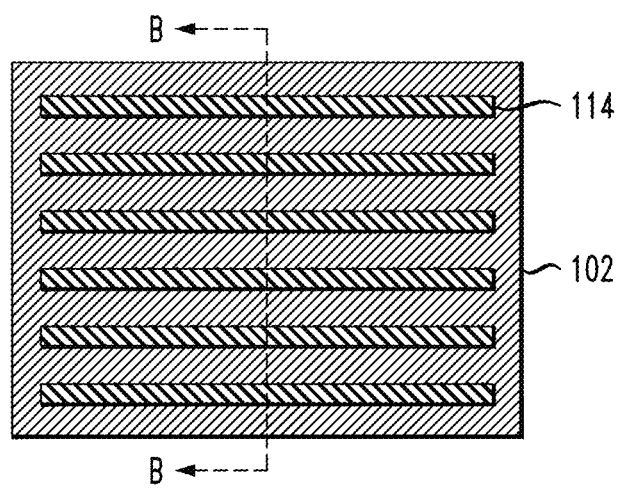
FIG. 9B depicts a top-down view of the FIG. 9A structure, according to an embodiment of the invention.

FIG. 9A depicts a side cross-sectional view 900 of the FIG. 8A structure following etching of the dielectric 112 and the spacer material 110 exposed by the set of fins of spacer material 114. The side cross-sectional view 900 is taken along the line B-B in the top-down view 950 of FIG. 9B. The dielectric 112 and spacer material 110 may be etched using RIE, ion beam etching (IBE), etc.

Figure 10A:
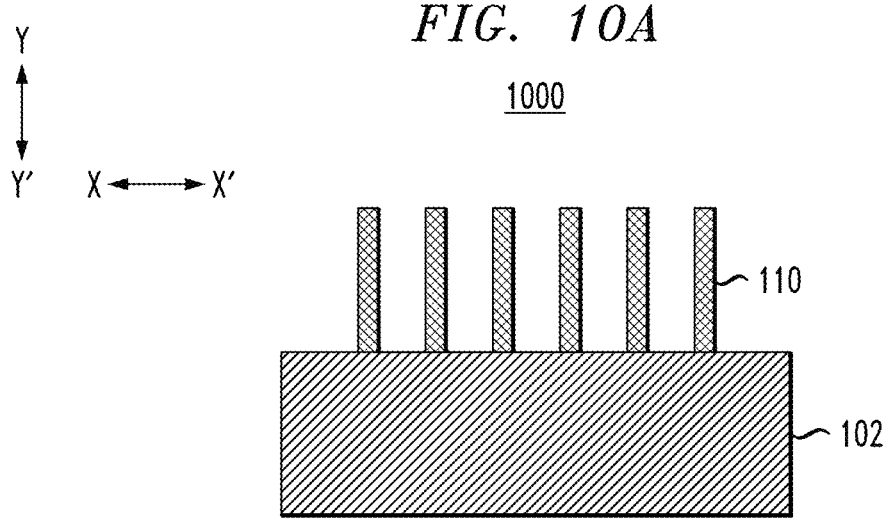
FIG. 10A depicts a side cross-sectional view of the FIG. 9A structure following removal of the second spacer material and remaining portions of the dielectric, according to an embodiment of the invention.

FIG. 10A depicts a side cross-sectional view 1000 of the FIG. 9A structure following removal of the spacer material 114 and the remaining dielectric 112. The side cross-sectional view 1000 is taken along the line B-B in the top-down view 1050 of FIG. 10B. The spacer material 114 and remaining dielectric 112 may be removed using wet etch, plasma etching, RIE, etc. As a result, a number of pillars of the spacer material 110 are formed over the MRAM stack 102. Such pillars are illustrated in the top-down view 1050 of FIG. 10B. The resulting structure illustrated in FIGS. 10A and 10B may be subject to further processing for MRAM cell patterning and encapsulation, which will be described in further detail below.

Figure 11A:
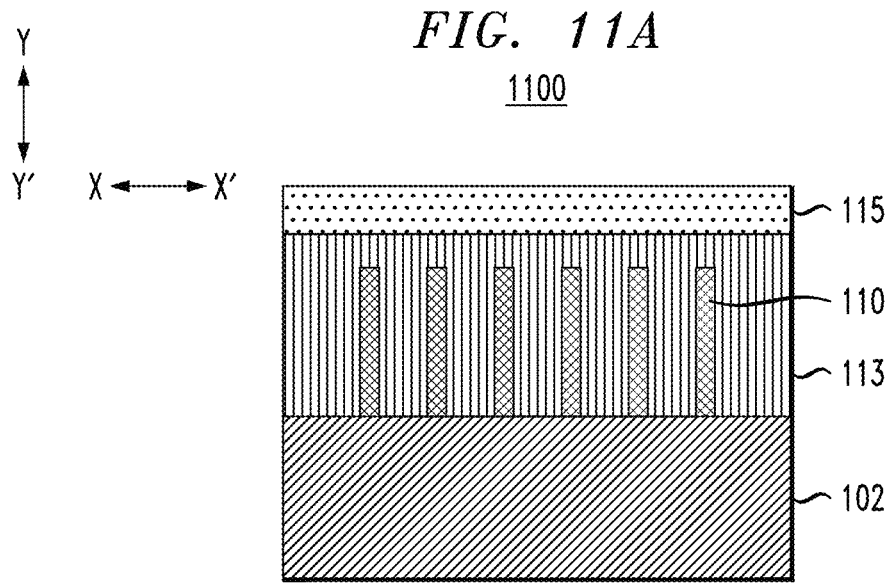
FIG. 11A depicts a side cross-sectional view of the FIG. 6A structure following deposition of a hard mask layer over the set of fins of the first spacer material deposition of an organic polymer layer (OPL) over the hard mask layer, according to an embodiment of the invention.
Figure 11B:
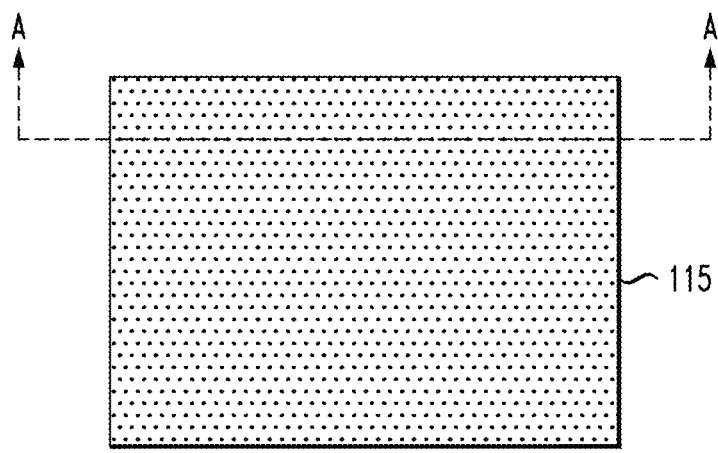
FIG. 11B depicts a top-down view of the FIG. 11A structure, according to an embodiment of the invention.

FIG. 11A depicts a side cross-sectional view 1100 of the FIG. 6A structure following deposition of an organic polymer layer (OPL) 113 over the set of fins of the spacer material 110, followed by deposition of a hard mask 115 over the OPL 113. The side cross-sectional view 1100 is taken along the line A-A in the top-down view 1150 of FIG. 11B. The OPL 113 may be formed of an oxide or amorphous silicon (a-Si), although other suitable materials may be used. The hard mask layer 115 may be formed of spin-on carbon, although other suitable materials such as spin on glass and CVD carbon may be used.

Figure 12A:
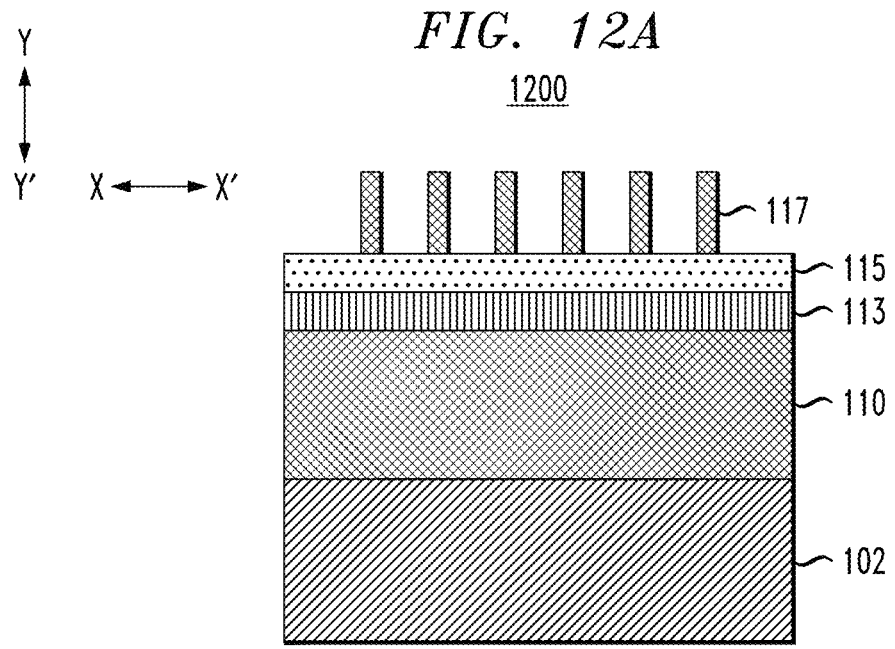
FIG. 12A depicts a side cross-sectional view of the FIG. 11A structure following patterning another set of fins of a second spacer material over the OPL, according to an embodiment of the invention.
Figure 12B:
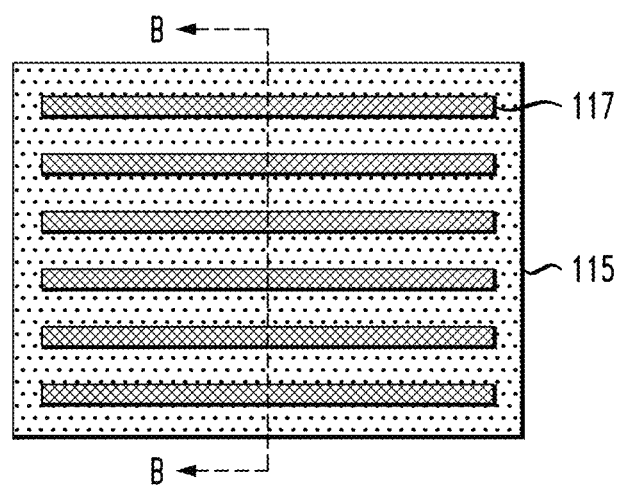
FIG. 12B depicts a top-down view of the FIG. 12A structure, according to an embodiment of the invention.

FIG. 12A depicts a side cross-sectional view 1200 of the FIG. 11A structure following patterning of a set of fins of spacer material 117 over a top surface of the hard mask 115. The side cross-sectional view 1200 is taken along the line B-B in the top-down view 1250 of FIG. 12B. The spacer material 117 may be the same material as the spacer material 110 (e.g., TaN although other suitable materials such as TiN, Si, SiO, SiN, HfO, and ZrO may be used). As illustrated, the set of fins of the spacer material 117 are substantially perpendicular to the set of fins of the spacer material 110. The set of fins of spacer material 117 may be formed using a SIT process similar to that described above with respect to formation of the set of fins of spacer material 110. The set of fins of spacer material 117 may have spacing or pitch in the range of 5 nm to 1000 nm.

Figure 13A:
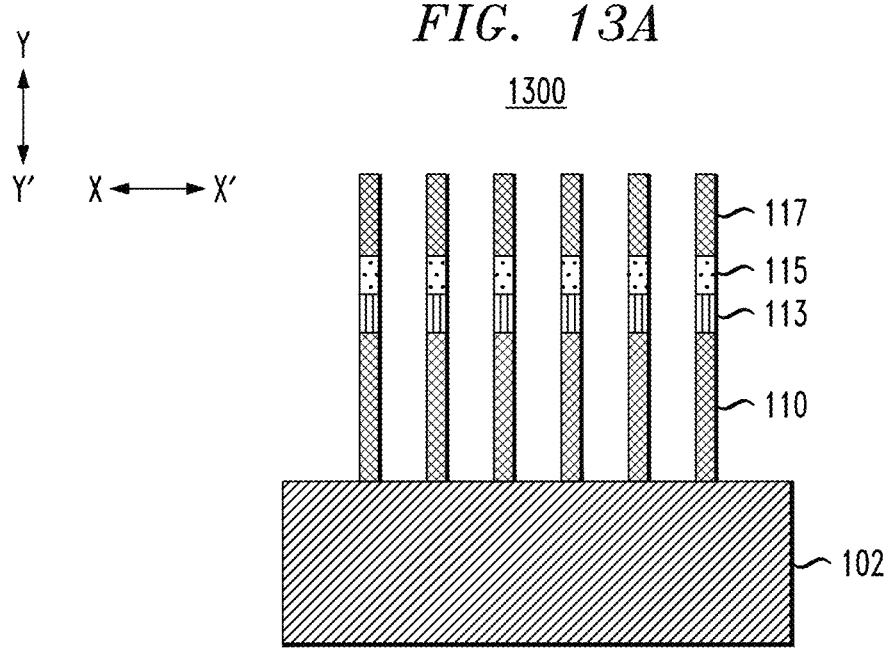
FIG. 13A depicts a side-cross sectional view of the FIG. 12A structure following etching of the set of fins of the second spacer material and etching of the OPL and hard mask layer to expose the top surface of the MRAM stack between the set of fins of the second spacer material, according to an embodiment of the invention.
Figure 13B:
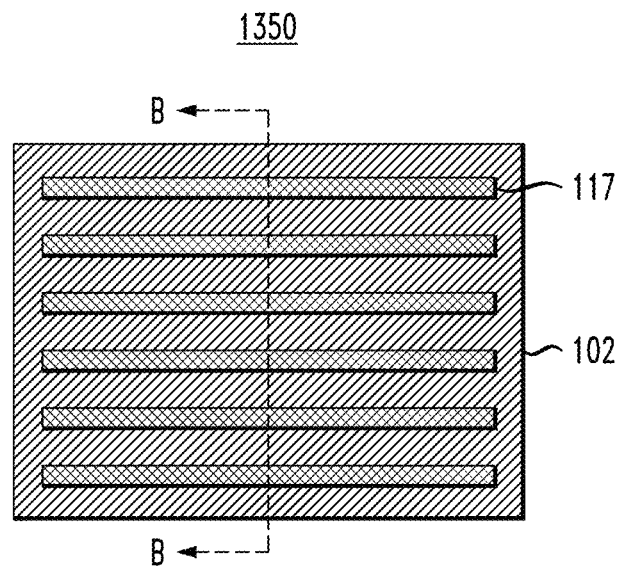
FIG. 13B depicts a top-down view of the FIG. 13A structure, according to an embodiment of the invention.

FIG. 13A depicts a side cross-sectional view 1300 of the FIG. 12A structure following etching of the set of fins of spacer material 117 along with etching of the OPL 113, hard mask layer 115 and spacer material 110 between the set of fins of spacer material 117. The side cross-sectional view 1300 is taken along the line B-B in the top-down view 1350 of FIG. 13B.

Figure 10B:
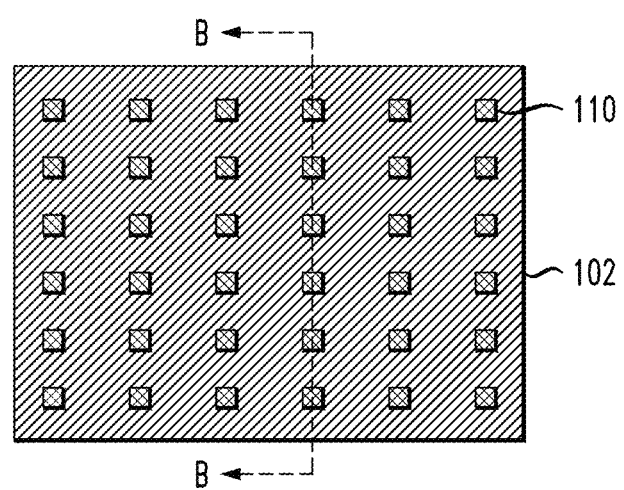
FIG. 10B depicts a top-down view of the FIG. 10A structure, according to an embodiment of the invention.

Following removal of the remaining portions of the OPL 113 and hard mask 115, the structure show in FIG. 10A and 10B is obtained with a number of pillars of the spacer material 110 formed over the MRAM stack 102. As mentioned above, the structure of FIGS. 10A and 10B may be subject to additional processing for MRAM cell patterning and encapsulation described in further detail below.

Figure 14:
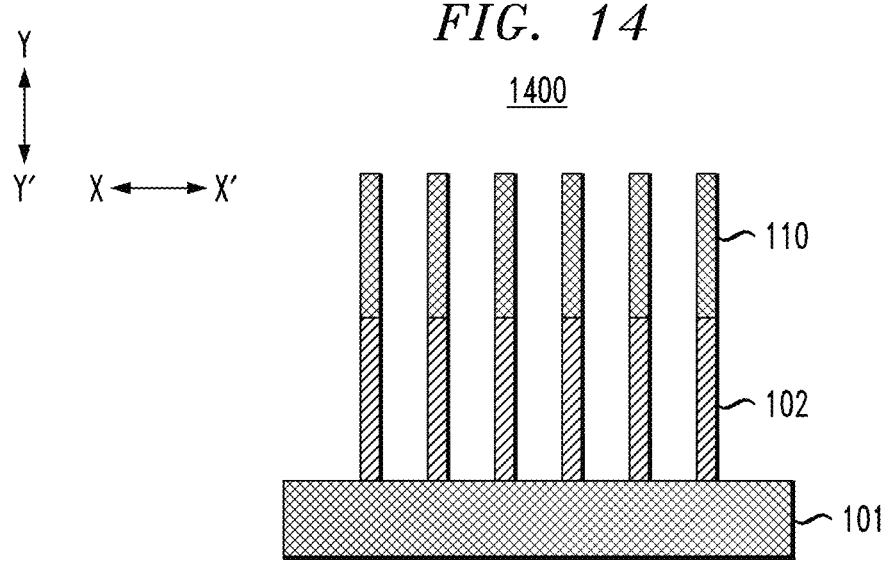
FIG. 14 depicts a side cross-sectional view of the FIG. 6A structure, formed over a substrate, following patterning of the MRAM stack exposed by the set of fins of the first spacer material, according to an embodiment of the invention.

FIG. 14 depicts a side cross-sectional view 1400 of the FIG. 6A structure following patterning of the MRAM stack 102 that is exposed by the set of fins of the spacer material 110, forming a set of fins of the MRAM stack 102 matching the set of fins of the spacer material 110. In the FIG. 14 structure, the MRAM stack 102 is shown formed over a substrate 101. The substrate 101 may be the same material as that of the spacers 110 (e.g., TaN) although other suitable materials such as W, TiN, Ru, Pd, Au, and Ir may be used.

Figure 15:
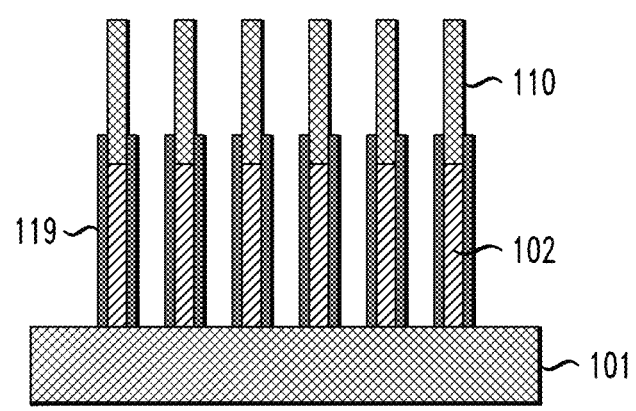
FIG. 15 depicts a side cross-sectional view of the FIG. 14 structure following encapsulation of exposed sidewalls of the MRAM stack, according to an embodiment of the invention.

FIG. 15 depicts a side cross-sectional view 1500 of the FIG. 14 structure following encapsulation of the exposed sidewalls of the MRAM stack 102 with encapsulation material 119. The encapsulation material 119 may comprise oxygen free dielectric material such as SiN. The exposed sidewalls of the MRAM stack 102 may be encapsulated by ALD, CVD, or PVD processing. A horizontal thickness or width (in direction X-X') of the encapsulation material 119 may be in the range of 2 nm to 1000 nm. As shown, the encapsulation material 119 also covers a portion of the set of fins of spacer material 110.

Figure 16A:
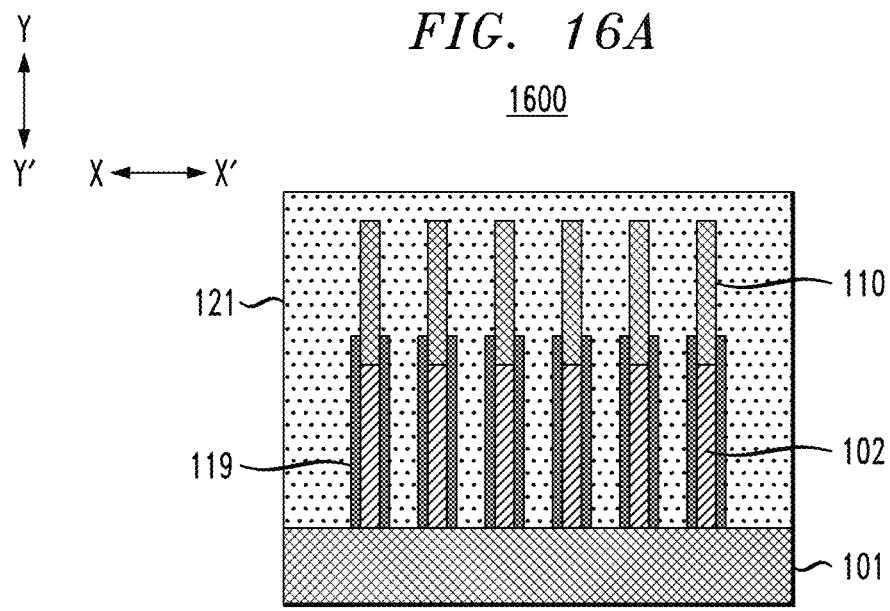
FIG. 16A depicts a side cross-sectional view of the FIG. 15 structure following fill of a dielectric over encapsulated MRAM stack and the set of fins of the first spacer material, according to an embodiment of the invention.
Figure 16B:
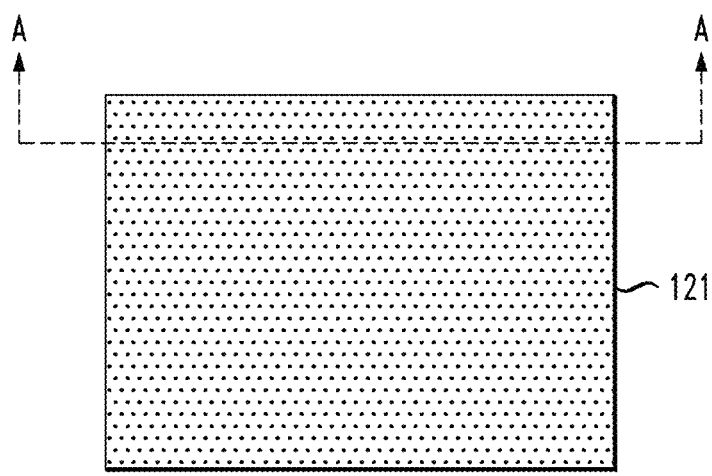
FIG. 16B depicts a top-down view of the FIG. 16A structure, according to an embodiment of the invention.

FIG. 16A depicts a side cross-sectional view 1600 of the FIG. 15 structure, following fill with a dielectric 121. The side cross-sectional view 1600 is taken along the line A-A in the top-down view 1650 of FIG. 16B. The dielectric 121 may be planarized after filling regions between the set of fins of the MRAM stack 102 and spacer material 110. A vertical thickness or height (in direction Y-Y') of the dielectric 121 from a top surface of the substrate 101 is in the range of 30 nm to 1000 nm. The dielectric 121 may be an oxide, although other suitable materials such as low-k dielectric, SiN, and air gap may be used.

Figure 17A:
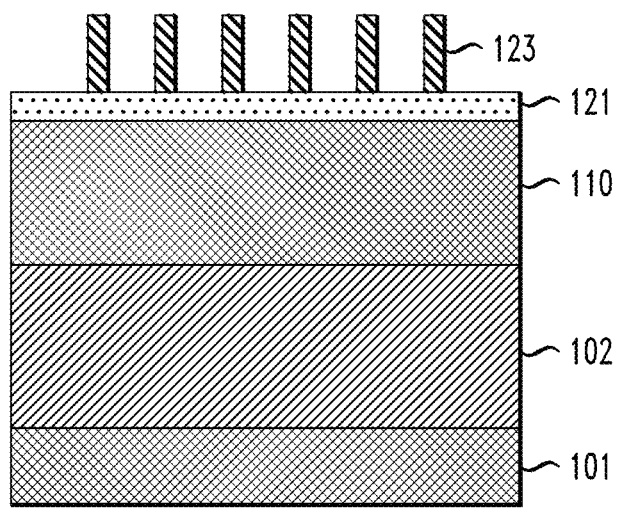
FIG. 17A depicts a side cross-sectional view of the FIG. 16A structure following patterning another set of fins of a second spacer material over the dielectric, according to an embodiment of the invention.
Figure 17B:
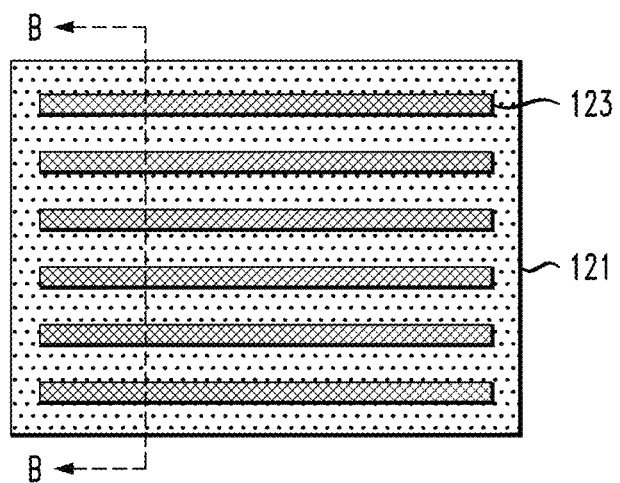
FIG. 17B depicts a top-down view of the FIG. 17A structure, according to an embodiment of the invention.

FIG. 17A depicts a side cross-sectional view 1700 of the FIG. 16A structure following patterning a set of fins of another spacer material 123 over a top surface of the dielectric 121. The side cross-sectional view 1700 is taken along the line B-B in the top-down view 1750 of FIG. 17B. The spacer material 123 may be SiN, although other suitable materials such as TaN, SiO, Si, TiN, HfO and ZrO may be used. The set of fins of spacer material 123 may be formed using SIT, in a manner similar to that described above with respect to formation of the set of fins of spacer material 110. The SIT processing may be similar to that described above with respect to FIGS. 1-6 or FIGS. 11-12. The set of fins of spacer material 123 may be formed with spacing or pitch in the range of 5 nm to 1000 nm. As illustrated, the set of fins of spacer material 123 are formed substantially perpendicular to that of the set of fins of spacer material 110.

Figure 18A:
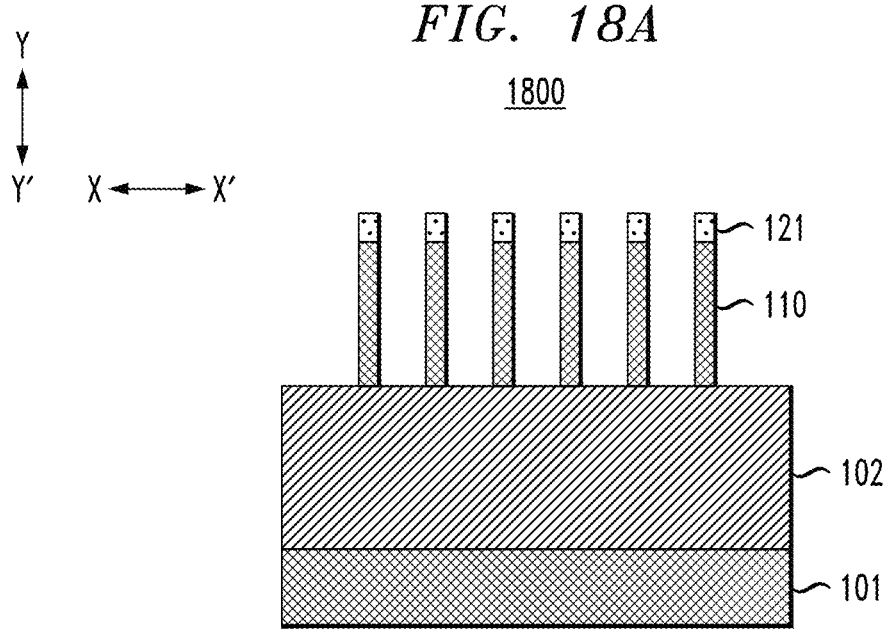
FIG. 18A depicts a side cross-sectional view of the FIG. 17A structure following etching of the set of fins of the second spacer material and etching of the dielectric and the first spacer material between the set of fins of the second spacer material to expose a top surface of the MRAM stack, according to an embodiment of the invention.
Figure 18B:
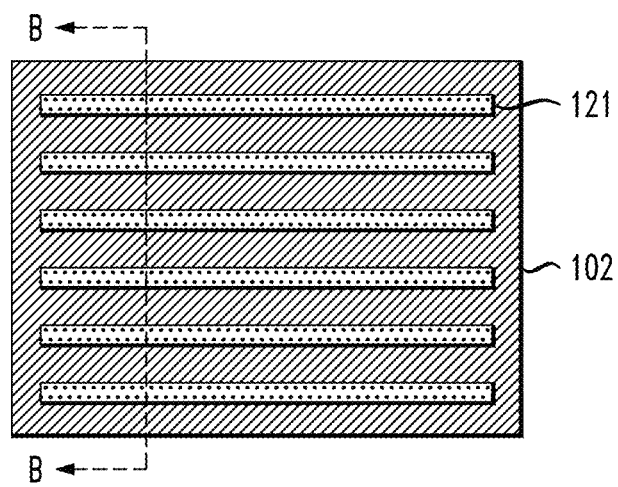
FIG. 18B depicts a top-down view of the FIG. 18A structure, according to an embodiment of the invention.

FIG. 18A depicts a side cross-sectional view 1800 of the FIG. 17A structure following etching of the set of fins of spacer material 123, along with the dielectric 121 and spacer material 110 that is exposed between the set of fins of spacer material 123. The side cross-sectional view 1800 is taken along the line B-B in the top-down view 1850 of FIG. 18B. The etch process in FIG. 17 may be IBE, ME, etc.

Figure 19A:
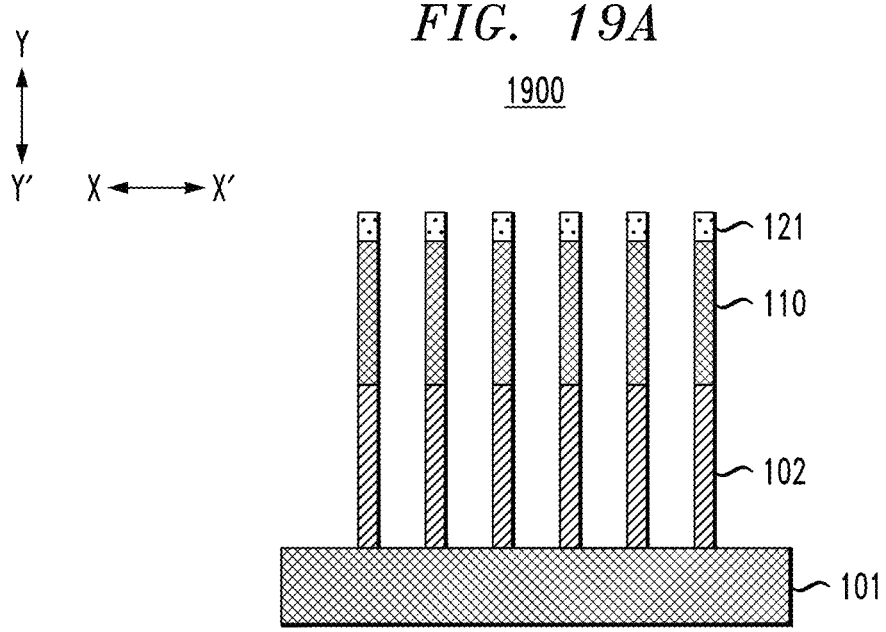
FIG. 19A depicts a side cross-sectional view of the FIG. 18A structure following etching of the MRAM stack not covered by the dielectric to expose a top surface of the substrate, according to an embodiment of the invention.
Figure 19B:
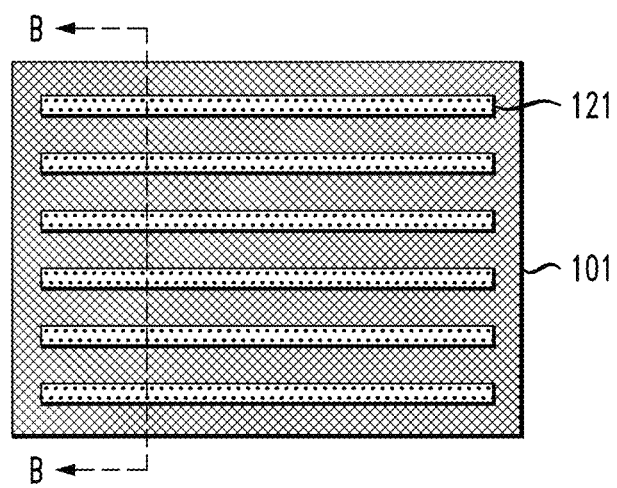
FIG. 19B depicts a top-down view of the FIG. 19A structure, according to an embodiment of the invention.

FIG. 19A depicts a side cross-sectional view 1900 of the FIG. 18A structure following etching portions of the set of fins of the MRAM stack 102 left exposed by the dielectric 121 covering portions of the set of fins of the spacer material 110. The side cross-sectional view 1900 is taken along the line B-B in the top-down view 1950 of FIG. 19B. The etching of FIG. 18 results in formation of pillars of the MRAM stack 102, with spacer material 110 formed over each of the pillars. From the encapsulation described above with respect to FIG. 15, two sides of the MRAM pillars are already encapsulated with the encapsulation material 119. As will be described in further detail below, the remaining exposed portions of the MRAM pillars will also be encapsulated with encapsulation material 119. The etching of FIG. 19 may use a process of IBE, ME, etc.

Figure 20A:
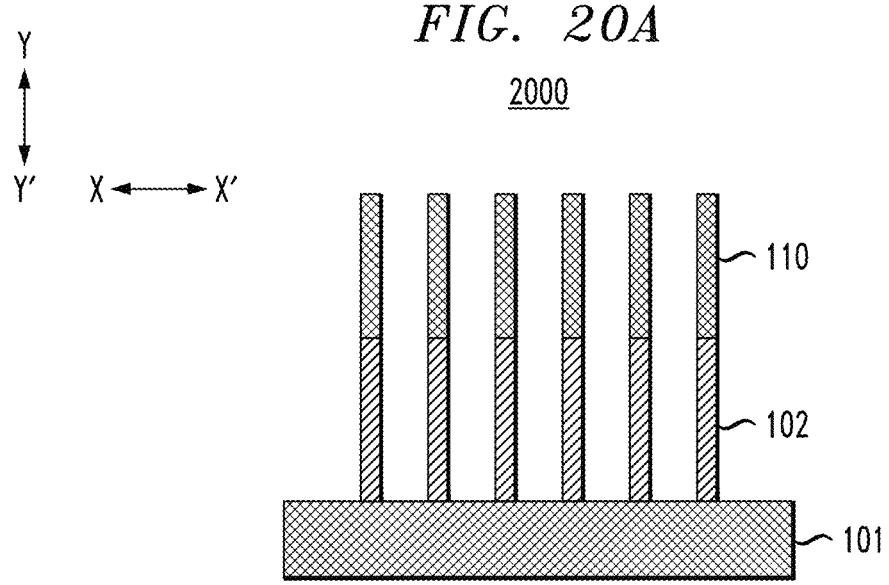
FIG. 20A depicts a side cross-sectional view of the FIG. 19A structure following removal of remaining portions of the dielectric, according to an embodiment of the invention.
Figure 20B:
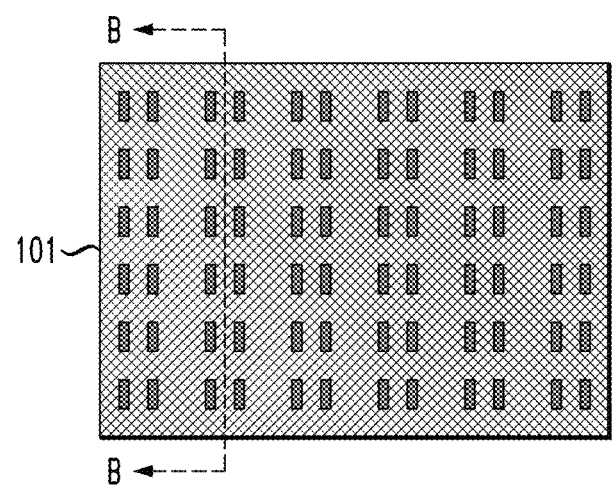
FIG. 20B depicts a top-down view of the FIG. 20A structure, according to an embodiment of the invention.

FIG. 20A depicts a side cross-sectional view 2000 of the FIG. 19A structure following removal of remaining portions of the dielectric 121. The side cross-sectional view 2000 is taken along the line B-B in the top-down view 2050 of FIG. 20B. The remaining portions of the dielectric 121 may be removed using ME, plasma etching, wet etch, etc.

Figure 21A:
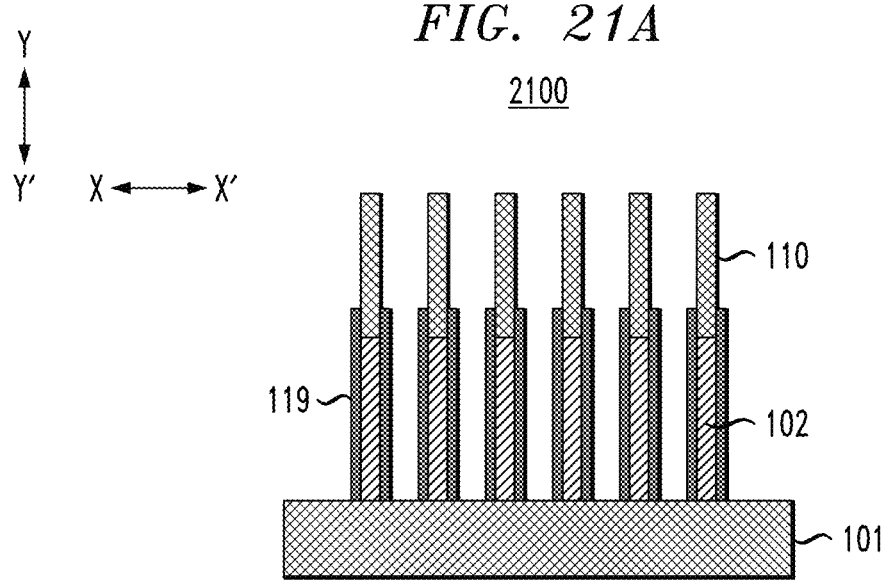
FIG. 21A depicts a side cross-sectional view of the FIG. 20A structure following encapsulation of exposed sidewalls of the MRAM stack, according to an embodiment of the invention.
Figure 21B:
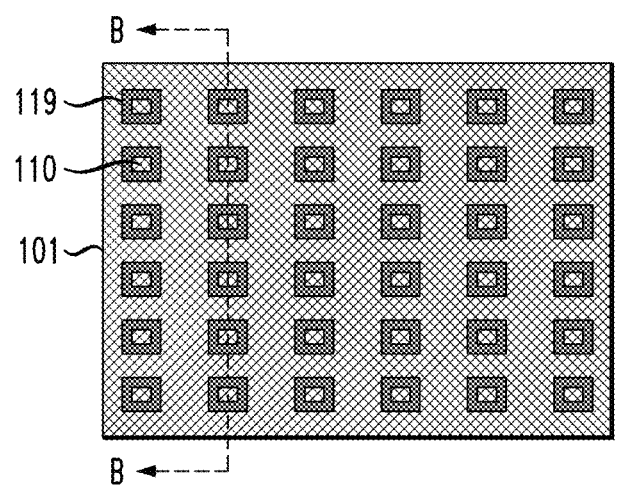
FIG. 21B depicts a top-down view of the FIG. 21A structure, according to an embodiment of the invention.

FIG. 21A depicts a side cross-sectional view 2100 of the FIG. 20A structure following encapsulation of exposed sidewalls of the MRAM pillars 102 with encapsulation material 119. The side cross-sectional view 2100 is taken along the line B-B in the top-down view 2150 of FIG. 21B. The encapsulation of the exposed sidewalls of the MRAM pillars 102 may result in a uniform thickness of encapsulation layer surrounding each pillar in the range of 3 nm to 100 nm. As a result of the processing in FIG. 21, each MRAM pillar 102 is encapsulated on all sides with the encapsulation material 119. Each MRAM pillar 101 may be an MRAM cell of an MRAM device, with the spacer material 110 formed over each MRAM pillar 101 being used as a top electrode for each of the MRAM cells.

Figure 22:
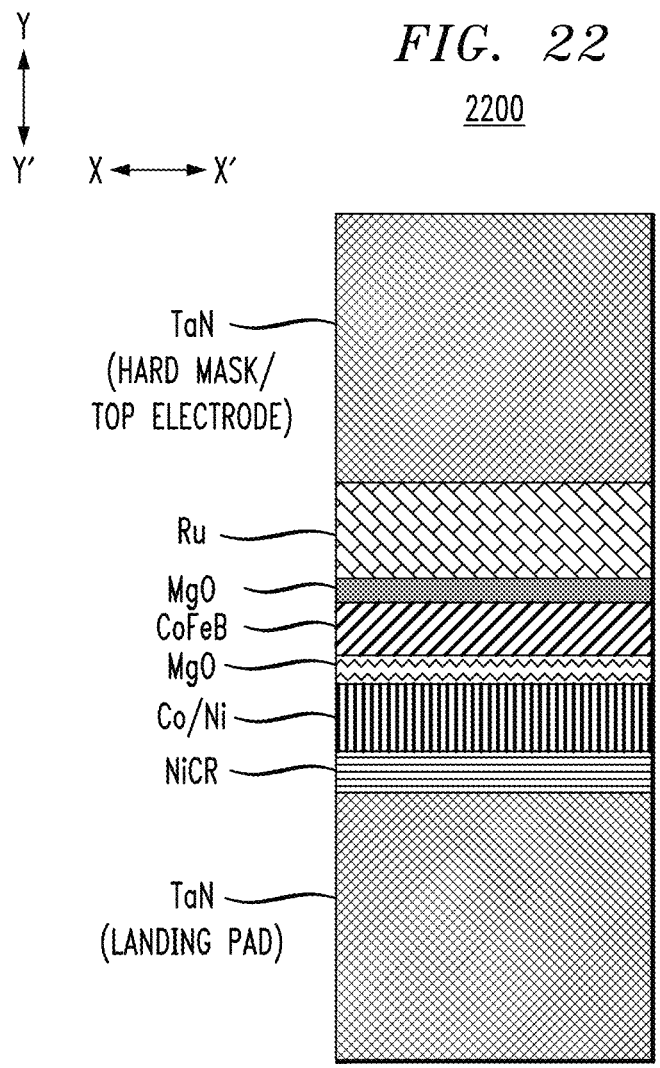
FIG. 22 depicts layers of an MRAM stack, according to an embodiment of the invention.

FIG. 22 shows a side cross-sectional view 2200 of an MRAM stack. The MRAM stack includes a TaN landing pad, which may have a vertical thickness or height (in direction Y-Y') of 40 nm. The TaN landing pad is an example of the substrate 101 described above. A nickel chromium (NiCr) layer is disposed over the TaN launching pad. The NiCr layer may have a vertical thickness or height (in direction Y-Y') of 5 nm. A cobalt (Co) or nickel (Ni) layer is disposed over the NiCr layer. The Co/Ni layer may have a vertical thickness or height (in direction Y-Y') of 11 nm. A first magnesium oxide (MgO) layer is disposed over the Co/Ni layer. The first MgO layer may have a vertical thickness or height (in direction Y-Y') of 1-2 nm. A cobalt-iron-boron (CoFeB) layer is disposed over the first MgO layer. The CoFeB layer may have a vertical thickness or height (in direction Y-Y') of 1.7 nm. A second MgO layer is disposed over the CoFeB layer. The second MgO layer may have a vertical thickness or height (in direction Y-Y') of 1-2 nm. A Ru layer is disposed over the second MgO layer. The Ru layer may have a vertical thickness or height (in direction Y-Y') of 20 nm. A TaN hard mask layer is disposed over the Ru layer. The TaN hard mask layer may have a vertical thickness or height (in direction Y-Y') of 50-200 nm. The TaN hard mask layer disposed over the Ru layer is an example of the spacer material 110 which may be patterned using first and second SIT processes as described above, and is utilized as a top electrode for each MRAM cell in some embodiments.

SIT, in addition to advantages in improved CDU, also offers capability for scaling to sub-193 resolution pitches (e.g., less than 80 nm) and extremely small CDs (e.g., about 5 nm). In the discussion below, is it assumed that the MRAM hard mask material is TaN, which is the spacer material for SIT. The MRAM hard mask material, as discussed above, may be used in the final structure as the top electrode for MRAM cells, thus eliminating a hard mask etching step that limits the smallest size and worsens size uniformity for conventional MRAM devices. TaN spacer SIT with 100 nm pitch mandrels at 10 nm CD may be achieved landing on the Ru surface (e.g., a material of a top layer of MRAM stack 102). Mandrels may be patterned with electron beam (e-beam) lithography techniques. Experimental results show an ability to achieve TaN spacers with heights of approximately 20 nm at 20 nm CD, with mandrels patterned with 193-dry lithography at 200 nm pitch. The final TaN is at 100 nm pitch after SIT.

Experimental results further show an ability to achieve TaN spacers with heights of approximately 70 nm at 20 nm CD. Although pitch walking causes space difference between lines to be non-uniform, the line CD control is very good with an average TaN line pitch of 100 nm. Line width roughness (LWR), line edge roughness (LER) and CD measurements for experimental results include: CD of 25.5±0.05 nm, LWR of 0.72±0.02 nm and LER of 2.15±0.08 nm. LWR below 1 nm may be achieved with TaN hard mask material and an aspect ratio greater than three.

MRAM patterning techniques will now be described in further detail. It is assumed, in the discussion below, that the structure shown in FIGS. 10A and 10B is achieved, with multiple pillars of spacer material 110 formed over a top surface of MRAM stack 102. The spacer material 110 acts as a hard mask during patterning of the MRAM stack, to form a plurality of MRAM cells (e.g., an MRAM cell is patterned under each of the pillars of spacer material 110).

MRAM patterning may utilize ion beam etching (IBE). The IBE may utilize an argon (Ar) beam with 1000V at 40 degrees, with beam current of 240 milliamps (mA). For the description below, it is assumed that the MRAM stack of FIG. 22 is used, with a single pillar of the TaN hard mask layer having an initial height of 60 nm with a CD of 20 nm formed over the MRAM stack. After 60 seconds of the IBE, 40 nm of the TaN hard mask layer remains, and the CD of the first MgO layer is 34 nm with redeposition, 33 nm without redeposition. After 80 seconds of the IBE, 34 nm of the TaN hard mask layer remains, and the CD of the first MgO layer is 40 nm with redeposition, 33 nm without redeposition. After 100 seconds of the IBE, 28 nm of the TaN hard mask layer remain, and the CD of the first MgO layer is 43 nm with redeposition, 33 nm without redeposition. After 120 seconds of the IBE, 22 nm of the TaN hard mask layer remain, and the CD of the first MgO layer is 44 nm with redeposition, 33 nm without redeposition.

Different CD may be achieved using arrays of pillars of the spacer material 110 formed over MRAM stack 102. In the description below, it is assumed that a grid or 3×3 array of nine TaN hard mask pillars is formed over the MRAM stack of FIG. 22. With 200V Ar IBE at 45 degrees and after 420 seconds, the CD is 25 nm with a height of the TaN hard mask layer being 56 nm. With 200V Ar IBE at 50 degrees and after 480 seconds, the CD is 18 nm with a height of the TaN hard mask layer being 56 nm. After the main 200V Ar IBE etch, clean up IBE may be used to clean up resulting redeposition. For example, clean up 100V Ar IBE etches at 40 degrees or 60 degrees may be utilized.

The above-described experimental modeling shows that a 20 nm CD hard mask TaN pillar survives IBE, and can give CD of approximately 33 nm, though with a significant amount of redeposition. Clean up IBE steps, such as at 70-80 degrees angle (from normal) may be used to clean up redeposition. As an alternative to clean up IBE steps, the main IBE process may use a higher angle (e.g., 50-55 degrees) to minimize redeposition while maintaining MTJ CD. Of course, clean up IBE steps may be utilized even after a main IBE at such a higher angle if desired. In the example IBE processes described above, 25-40 nm of TaN hard mask material is consumed depending on the etch time. A typical thickness requirement for TaN top electrodes for MRAM cells to preserve after IBE may be 15 nm or thicker. As a result, starting TaN hard mask thickness of 50 nm-200 nm may be sufficient. Lower voltage IBE may be used for improved pillar profile, CD and redeposition. If desired, clean up IBE steps may be utilized with lower voltage IBE as discussed above.

In some embodiments, a method of forming a semiconductor structure comprises forming a first spacer material over two or more mandrels disposed over a magnetoresistive random-access memory (MRAM) stack. The method also comprises performing a first SIT of the two or more mandrels to form a first set of fins of the first spacer material over the MRAM stack, and performing a second SIT to form a plurality of pillars of the first spacer material over the MRAM stack. The pillars of the first spacer material form top electrodes for a plurality of MRAM cells patterned from the MRAM stack.

In some embodiments, the first spacer material comprises TaN. The first SIT may be in a first direction, and the second SIT may be in a second direction substantially perpendicular to the first direction.

The method may further comprise forming a first layer over the MRAM stack, forming a hard mask over the first layer, patterning a resist layer over the hard mask, and etching the hard mask and the first layer exposed by the resist layer to expose a top surface of the MRAM stack forming the two or more mandrels. The first layer may comprise spin-on carbon, the hard mask may comprise SiN, and the resist layer may comprise a photo resist material. Forming the first spacer material over the two or more mandrels comprises depositing the first spacer material over the two or more mandrels. Performing the first SIT may comprise etching the first spacer material to expose at least a portion of the first layer and the top surface of the MRAM stack, etching the hard mask, and removing the first layer.

In some embodiments, performing the second SIT comprises depositing a dielectric over the first set of fins of the first spacer material, patterning a second spacer material over the oxide to form a second set of fins of the second spacer material, etching the oxide and the first spacer material exposed by the second set of fins to reveal a top surface of the MRAM stack, and removing the second spacer material and the oxide. The first spacer material may comprise TaN, the second spacer material may comprise SiN, and the dielectric may comprise an oxide. The first set of fins of the first spacer material may be substantially perpendicular to the second set of fins of the second spacer material.

In other embodiments, performing the second SIT comprises: (i) depositing an OPL over the first set of fins of the spacer material; (ii) depositing a hard mask layer over the OPL; (iii) patterning a second spacer material over the hard mask layer to form a second set of fins of the second spacer material; (iv) etching the second set of fins, and portions of the hard mask layer and the OPL exposed by the second set of fins to reveal a top surface of the MRAM stack in regions between the second set of fins; and (v) stripping a remaining portion of the hard mask layer and the OPL. The hard mask layer may comprise spin-on carbon, the OPL may comprise at least one of an oxide an a-Si, and the first and second spacer materials may comprise TaN. The first set of fins of the first spacer material may be substantially perpendicular to the second set of fins of the second spacer material.

In some embodiments, the method further comprises patterning and encapsulating the MRAM cells following the second sidewall image transfer process.

In some embodiments, the method further comprises, subsequent to performing the first SIT and prior to performing the second SIT, patterning the MRAM stack between the first set of fins to expose a substrate on which the MRAM stack is disposed and encapsulating exposed sidewalls of the patterned MRAM stack. Performing the second SIT may comprise: (i) depositing a dielectric over the substrate, the encapsulated sidewalls of the MRAM stack and the first set of fins of the first spacer material; (ii) patterning a second set of fins of a second spacer material over the dielectric; (iii) etching the second set of fins, and portions of the dielectric and the first set of fins to reveal a top surface of the MRAM stack in regions between the second set of fins; (iv) etching the MRAM stack between the second set of fins to expose the substrate to form the plurality of MRAM cells; and (v) removing the dielectric. The dielectric may comprise an oxide, the first spacer material may comprise TaN, and the second spacer material may comprise SiN. The first set of fins of the first spacer material may be substantially perpendicular to the second set of fins of the second spacer material. The method may further comprise encapsulating remaining exposed sidewalls of the MRAM cells.

In some embodiments, a semiconductor structure comprises a substrate, a plurality of MRAM cells disposed over the substrate, and a plurality of top electrodes disposed over a top surface of each of the MRAM cells. The plurality of MRAM cells are patterned from an MRAM stack using a first SIT and a second SIT. The top electrodes comprise a spacer material used to pattern the MRAM stack in the first SIT.

In some embodiments, an integrated circuit comprises an MRAM device comprising a substrate, a plurality of MRAM cells disposed over the substrate, and a plurality of top electrodes disposed over a top surface of each of the MRAM cells. The plurality of MRAM cells are patterned from an MRAM stack using a first SIT and a second SIT. The top electrodes comprise a spacer material used to pattern the MRAM stack in the first SIT.

It is to be appreciated that the various materials, processing methods (e.g., etch types, deposition types, etc.) and dimensions provided in the discussion above are presented by way of example only. Various other suitable materials processing methods and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
   forming a first spacer material over two or more mandrels disposed over a magnetoresistive random-access memory (MRAM) stack;
   performing a first sidewall image transfer of the two or more mandrels to form a first set of fins of the first spacer material over the MRAM stack; and
   performing a second sidewall image transfer to form a plurality of pillars of the first spacer material over the MRAM stack;
   wherein the pillars of the first spacer material form top electrodes for a plurality of MRAM cells patterned from the MRAM stack; and
   wherein the first spacer material comprises tantalum nitride.

2. The method of claim 1, wherein the first sidewall image transfer is in a first direction and the second sidewall image transfer is in a second direction substantially perpendicular to the first direction.

3. The method of claim 1, wherein performing the second sidewall image transfer comprises:
   depositing a dielectric over the first set of fins of the first spacer material;
   patterning a second spacer material over the dielectric to form a second set of fins of the second spacer material;
   etching the dielectric and the first spacer material exposed by the second set of fins to reveal a top surface of the MRAM stack; and
   removing the second spacer material and the dielectric.

4. The method of claim 3, wherein the first spacer material comprises tantalum nitride, the second spacer material comprises silicon nitride, and the dielectric comprises an oxide.

5. The method of claim 3, wherein the first set of fins of the first spacer material are substantially perpendicular to the second set of fins of the second spacer material.

6. The method of claim 1, wherein performing the second sidewall image transfer comprises:
   depositing an organic polymer layer (OPL) over the first set of fins of the spacer material;
   depositing a hard mask layer over the OPL;
   patterning a second spacer material over the hard mask layer to form a second set of fins of the second spacer material;
   etching the second set of fins, and portions of the hard mask layer and the OPL exposed by the second set of fins to reveal a top surface of the MRAM stack in regions between the second set of fins; and
   stripping a remaining portion of the hard mask layer and the OPL.

7. The method of claim 6, wherein:
   the hard mask layer comprises spin-on carbon;
   the OPL comprises at least one of an oxide and amorphous silicon;
   the first spacer material and the second spacer material comprise tantalum nitride.

8. The method of claim 1, further comprising patterning and encapsulating the MRAM cells following the second sidewall image transfer process.

9. The method of claim 1, further comprising, subsequent to performing the first sidewall image transfer and prior to performing the second sidewall image transfer:
   patterning the MRAM stack between the first set of fins to expose a substrate on which the MRAM stack is disposed; and
   encapsulating exposed sidewalls of the patterned MRAM stack.

10. The method of claim 9, wherein performing the second sidewall image transfer comprises:
    depositing a dielectric over the substrate, the encapsulated sidewalls of the MRAM stack and the first set of fins of the first spacer material;
    patterning a second set of fins of a second spacer material over the dielectric;
    etching the second set of fins, and portions of the dielectric and the first set of fins to reveal a top surface of the MRAM stack in regions between the second set of fins;
    etching the MRAM stack between the second set of fins to expose the substrate to form the plurality of MRAM cells; and
    removing the dielectric.

11. The method of claim 10, wherein the dielectric comprises oxide, the first spacer material comprises tantalum nitride and the second spacer material comprises silicon nitride.

12. The method of claim 10, wherein the first set of fins of the first spacer material are substantially perpendicular to the second set of fins of the second spacer material.

13. The method of claim 10, further comprising encapsulating remaining exposed sidewalls of the MRAM cells.

14. A method of forming a semiconductor structure, comprising:
    forming a first spacer material over two or more mandrels disposed over a magnetoresistive random-access memory (MRAM) stack;
    performing a first sidewall image transfer of the two or more mandrels to form a first set of fins of the first spacer material over the MRAM stack;
    performing a second sidewall image transfer to form a plurality of pillars of the first spacer material over the MRAM stack;
    wherein the pillars of the first spacer material form top electrodes for a plurality of MRAM cells patterned from the MRAM stack; and
    further comprising:
       forming a first layer over the MRAM stack;
       forming a hard mask over the first layer;
       patterning a resist layer over the hard mask; and
       etching the hard mask and the first layer exposed by the resist layer to expose a top surface of the MRAM stack forming the two or more mandrels.

15. The method of claim 14, wherein the first layer comprises spin-on carbon, the hard mask comprises silicon nitride and the resist layer comprises a photo resist material.

16. The method of claim 14, wherein forming the first spacer material over the two or more mandrels comprises depositing the first spacer material over the two or more mandrels, and wherein performing the first sidewall image transfer comprises:
    etching the first spacer material to expose at least a portion of the first layer and the top surface of the MRAM stack;
    etching the hard mask; and
    removing the first layer.

17. A method of forming a semiconductor structure, comprising:
    forming a first spacer material over two or more mandrels disposed over a magnetoresistive random-access memory (MRAM) stack;
    performing a first sidewall image transfer of the two or more mandrels to form a first set of fins of the first spacer material over the MRAM stack; and
    performing a second sidewall image transfer to form a plurality of pillars of the first spacer material over the MRAM stack;
    wherein the pillars of the first spacer material form top electrodes for a plurality of MRAM cells patterned from the MRAM stack;
    wherein performing the second sidewall image transfer comprises:
       depositing an organic polymer layer (OPL) over the first set of fins of the spacer material:
       depositing a hard mask layer over the OPL;
       patterning a second spacer material over the hard mask layer to form a second set of fins of the second spacer material;
       etching the second set of fins, and portions of the hard mask layer and the OPL exposed by the second set of fins to reveal a top surface of the MRAM stack in regions between the second set of fins; and
       stripping a remaining portion of the hard mask layer and the OPL; and
    wherein the first set of fins of the first spacer material are substantially perpendicular to the second set of fins of the second spacer material.

* * * * *